US012165733B2

(12) United States Patent
Khwa et al.

(10) Patent No.: US 12,165,733 B2
(45) Date of Patent: Dec. 10, 2024

(54) SENSE AMPLIFIER, MEMORY DEVICE AND OPERATION METHOD THEREOF (71) Applicant: Taiwan Semiconductor Manufacturing Company, Ltd., Hsinchu (TW)

(72) Inventors: Win-San Khwa, Taipei (TW); Yen-Cheng Chiu, Hsinchu (TW); Yi-Lun Lu, New Taipei (TW); Jui-Jen Wu, Hsinchu (TW); Meng-Fan Chang, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 419 days.

(21) Appl. No.: 17/720,296

(22) Filed: Apr. 14, 2022

(65) Prior Publication Data
US 2022/0415369 A1    Dec. 29, 2022

Related U.S. Application Data (60) Provisional application No. 63/214,790, filed on Jun. 25, 2021.

(51) Int. Cl.
G11C 7/06    (2006.01)
G11C 7/08    (2006.01)
G11C 7/12    (2006.01)

(52) U.S. Cl.
CPC ............ G11C 7/065 (2013.01); G11C 7/08 (2013.01); G11C 7/12 (2013.01)

(58) Field of Classification Search
CPC .................... G11C 7/065; G11C 7/12
USPC .................................. 365/207
See application file for complete search history.

(56) References Cited

U.S. PATENT DOCUMENTS

2013/0064008 A1*  3/2013  Kim .............. G11C 11/1673
                                                  365/158
2014/0269125 A1*  9/2014  Lin .................... G11C 7/06
                                                  365/203

* cited by examiner

Primary Examiner — Anthan Tran
(74) Attorney, Agent, or Firm — JCIPRNET (57) ABSTRACT A sense amplifier of a memory device that includes sense amplifier circuits and a reference sharing circuit is introduced. The sense amplifier circuits are configured to sense the plurality of bit lines according to an enable signal. The reference sharing circuit includes first switches and second switches that are coupled to the reference nodes and second reference nodes of the sense amplifier circuits, respectively. The first switches and second switches are controlled according to a control signal to control a first electrical connection among the first reference nodes, and to control a second electrical connection among the second reference nodes. An operation method of the sense amplifier and a memory device including the sense amplifier are also introduced.

20 Claims, 5 Drawing Sheets

SENSE AMPLIFIER, MEMORY DEVICE AND OPERATION METHOD THEREOF

CROSS-REFERENCE TO RELATED APPLICATION

This application claims the priority benefit of U.S. provisional application Ser. No. 63/214,790, filed on Jun. 25, 2021. The entirety of the above-mentioned patent application is hereby incorporated by reference herein and made a part of this specification.

BACKGROUND

A typical memory device includes a plurality of memory cells and a sense amplifier coupled to the memory cells. The sense amplifier is designed to sense values stored in the memory cells through bit lines connected to the memory cells. The sense amplifier may receive reference signals for sensing logic states of "1" and "0" through the bit lines. However, the existing design of the sense amplifier suffers from large sensing reference variability which reduces the reliability and performance of the sense amplifier.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

As a demand for a high-performance sense amplifier, it has grown a need for a creative design of the sense amplifier that may reduce the sensing reference variability and improve the performance of the sense amplifier. In accordance with some embodiments, a sense amplifier includes a plurality of sense amplifier circuits, and a reference sharing circuit. The sense amplifier circuits operate according to an enable signal (i.e., signal SAEN) and reference signals supplied from first and second reference nodes (i.e., reference nodes REF_0 and REF_1). The first reference nodes supply first reference signals for sensing a first logic value (i.e., "1"), and the second reference nodes supply second reference signals for sensing a second logic value (i.e., "0"). The reference sharing circuit includes a plurality of first switches and a plurality of second switches, wherein each of the first switches is coupled to one of the first reference nodes, and each of the second switches is coupled to one of the second reference nodes. The reference sharing circuit is configured switch on or off the first and the second switches according to a control signal, which is an inverted signal of the enable signal, to form or break the first electrical connection among the first reference nodes and a second electrical connection among the second reference nodes. As the formation of the first electrical connection among the first reference nodes and the second electrical connection among the second reference nodes, the variability of the reference signals from the first reference nodes and the variability of the reference signals from the second reference nodes are reduced. Accordingly, the performance of the sense amplifier is improved.

Figure 1:
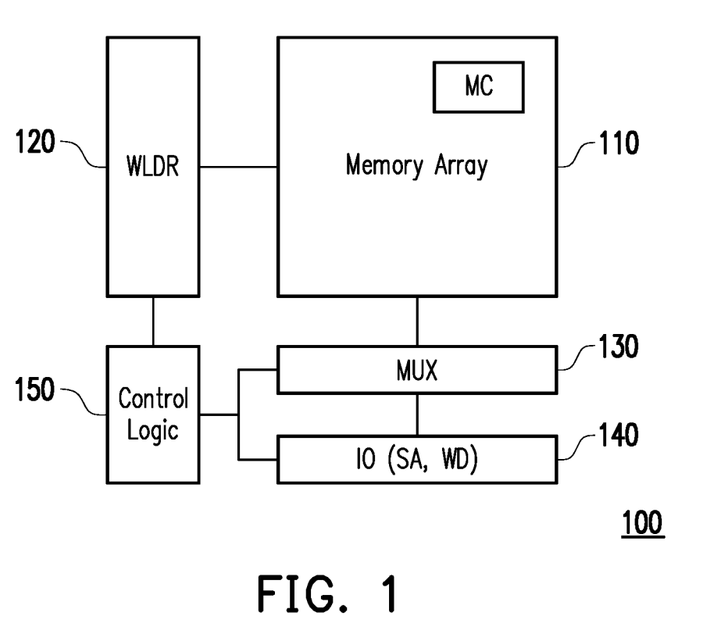
FIG. 1 is a schematic diagram of a memory device in accordance with some embodiments.

FIG. 1 illustrates a schematic diagram of a memory device 100 in accordance with some embodiments. The memory device 100 may include a memory array 110, a word line driver 120, a multiplexer 130, input/output (IO) circuit 140 and a control logic 150. The memory array 110 may include a plurality of memory cells MC arranged in an array structure including rows and columns. The memory array 110 may further includes a plurality of bit lines (not shown), word lines (not shown) and source lines (not shown) coupled to the memory cells MC, in which memory operations, such as a read operation, a program operation and an erase operation, are performed through the bit lines, the word lines and the source lines. It is noted that the type of the memory array 110 is not limited in the disclosure. The memory array 100 may be a volatile memory array or a non-volatile memory array, such as a static random-access memory (SRAM), a dynamic random-access memory (DRAM), a resistive random-access memory (RRAM), a magnetoresistive random-access memory (MRAM), a phase-change random-access memory (PCRAM), or any other type of memory.

The word line driver 120 is coupled to the memory array 110 and is configured to drive the word lines of the memory array 110. The multiplexer 130 is coupled to the memory array 110, and is configured to select at least one memory cell MC in the memory array 110 for a memory operation. The IO circuit 140 is coupled to the memory array 110 through the multiplexer 130, and is configured to perform the memory operation to the at least one memory cell MC of the memory array 110. The IO circuit 140 may include a sense amplifier (SA) that is configured to read data stored in the at least one memory cell MC in a read operation. The SA may read the data stored in the at least one memory cells by sensing the values from the bit lines coupled to the at least one memory cell MC. The IO circuit 140 may further include a write driver (WD) that is configured to write data to the at least one memory cell MC in a program operation. The control logic 150 is configured to generate control signals for controlling operations of the word line driver 120, the multiplexer 130 and the IO circuit 140.

Figure 2:
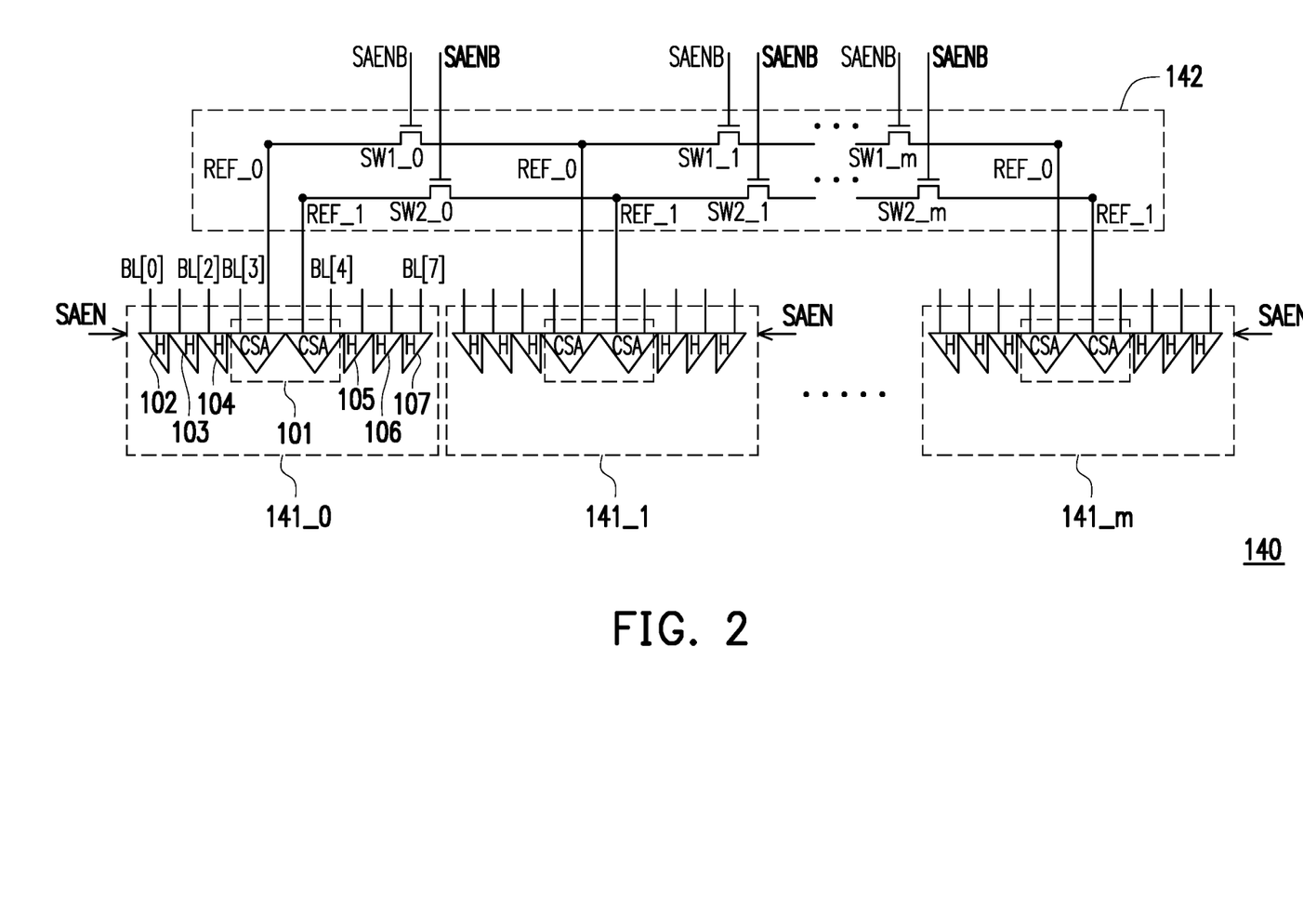
FIG. 2 is a schematic diagram of a sense amplifier in accordance with some embodiments.

FIG. 2 illustrates a schematic diagram of a sense amplifier 140 of a memory device (i.e., memory device 100 in FIG. 1) in accordance with some embodiments. The sense amplifier 140 may include a plurality of sense amplifier circuits 141_0 through 141_m and a reference sharing circuit 142, where m is positive integer. Each of the sense amplifier circuits 141_0 through 141_m is coupled to a plurality of bit lines of the memory array (i.e. memory array 110 in FIG. 1), and is configured to sense data from the plurality of bit lines in according to the an enable signal SAEN. Each of the sense amplifier circuits 141_0 through 141_m may read the plurality of bit lines to output multi-bit data one single memory access cycle. In other words, in one clock cycle, each of the sense amplifier circuits 141_0 through 141_m may output multiple bits that are sensed from the bit lines. In an example, each of the sense amplifier circuits 141_0 through 141_m is coupled to 8 bit lines, and is configured to output 8-bit data from the corresponding 8 bit lines in one single memory access cycle. It is noted that the number of bit lines coupled to each of the sense amplifier circuits 141_0 through 141_m is not limited to any specific number.

In some embodiments, each of the sense amplifier circuits 141_0 through 141_m includes a core sense circuit and a plurality of bit line pre-charge branch circuits. For example, the sense amplifier circuit 141_0 includes the core sense circuit 101 and a plurality of bit line pre-charge branch circuits 102 through 107. The core sense circuit 101 is coupled to bit lines BL[3] and BL[4] and a pair of reference nodes REF_0 and REF_1, where the reference signal from reference node REF_0 is different from the reference signal from the reference node REF_1. In the embodiments, the reference signal from the reference node REF_1 is used top sense data of a first logic state (i.e., logic state "1") and the reference signal from the reference node REF_0 is used to sense data of a second logic state (i.e., logic state "0"). The core sense circuit 101 is configured to sense the data from the bit lines BL[3] and BL[4] according to the enable signal SAEN. In addition, each of the bit line pre-charge branch circuits 102 through 107 is coupled to one corresponding bit line among the bit lines BL[0] through BL[2] and BL[5] through BL[7]. The bit line pre-charge branch circuits 102 through 107 are configured to pre-charge the bit lines BL[0] through BL[2] and BL[5] through BL[7], and couple the pre-charged bit lines BL[0] through BL[2] and BL[5] through BL[7] to the core sense circuit 101 for sensing data. The detailed descriptions about the operations of the core sense circuit 101 and the bit line pre-charge branch circuits 102 through 107 are described later with reference to FIG. 3 to FIG. 4. The sense amplifier circuits 141l through 141_m have substantially same circuit structures and operations as the sense amplifier circuits 141_0, thus the detailed description about sense amplifier circuits 141_1 through 141_m is omitted hereafter.

The reference sharing circuit 142 includes a plurality of switches SW1_0 through SW1_m and SW2_0 through SW2_m, in which each of the switches SW1_0 through SW1_m and SW2_0 through SW2_m includes a first terminal, a second terminal and a control terminal. The first terminal of each of the switches SW1_0 through SW1_m is coupled to the reference node REF_0 of one of the sense amplifier circuits 141_0 through 141_m; the second terminal of each of the switches SW1_0 through SW1_m is coupled to another one of the switches SW1_0 through SW1_m; and the control terminal of each of the switches SW1_0 through SW1_m receives a control signal SAENB. In addition, the first terminal of each of the switches SW2_0 through SW2_m is coupled to the reference node REF_1 of one of the sense amplifier circuits 141_0 through 141_m; the second terminal of each of the switches SW2_0 through SW2_m is coupled to another one of the switches SW2_0 through SW2_m; and the control terminal of each of the switches SW2_0 through SW2_m receives the control signal SAENB. In some embodiments, the switches SW1_0 through SW1_m and SW2_0 through SW2_m are transistors of same semiconductor type (e.g., n-type transistors), but the disclosure is not limited thereto.

In the embodiments, the reference sharing circuit 142 is configured to form or break a first electrical connection among the reference nodes REF_0 and a second electrical connection among the reference nodes REF_1 according to the control signal SAENB. For example, when the control signal SAENB is in the first logic state (i.e., logic state "1"), the switches SW1_0 through SW1_m and SW2_0 through SW2_m are switched on to form the first electrical connection among the reference node REF_0 and to form the second electrical connection among the reference node REF_1. In other words, the reference nodes REF_0 of the sense amplifier circuits 141_0 through 141_m are electrically connected to each other when the control signal SAENB is in the first logic state; and the reference nodes REF_1 of the sense amplifier circuits 141_0 through 141_m are electrically connected to each other when the control signal SAENB is in the first logic state. In this way, reference sensing variability of the reference signals from the reference nodes REF_0 and the reference sensing variability of the reference signals from the reference nodes REF_1 are reduced. When the control signal SAENB is in the second logic state (i.e., logic state "0"), the switches SW1_0 through SW1_m and SW2_0 through SW2_m are switched off to break the first electrical connection among the reference node REF_0 and the second electrical connection among the reference node REF_1.

In some embodiments, the control signal SAENB is an inverted signal of the enable signal SAEN of the sense amplifier circuits 141_0 through 141_m. In other words, when the enable signal SAEN is in the first logic state (i.e., "0"), the control signal SAENB is in the second logic state (i.e., "1"), an vice versa. As such, the switches SW1_0 through SW1_m and SW2_0 through SW2_m are switched on during a period when the enable signal SAEN is not asserted to the sense amplifier circuits 141_0 through 141_m (i.e., enable signal SAEN is in the logic state of "0"); and the switches SW1_0 through SW1_m and SW2_0 through SW2_m are switched off during a period when the enable signal SAEN is asserted to the sense amplifier circuits 141_0 through 141_m (i.e., enable signal SAEN is in the logic state of "1"). In this way, the sense amplifier 140 achieves effect of reducing the reference sensing variabilities of the reference signals from the reference nodes REF_0 and REF_1, while still maintain the normal sensing operations of the sense amplifier 140.

Figure 3:
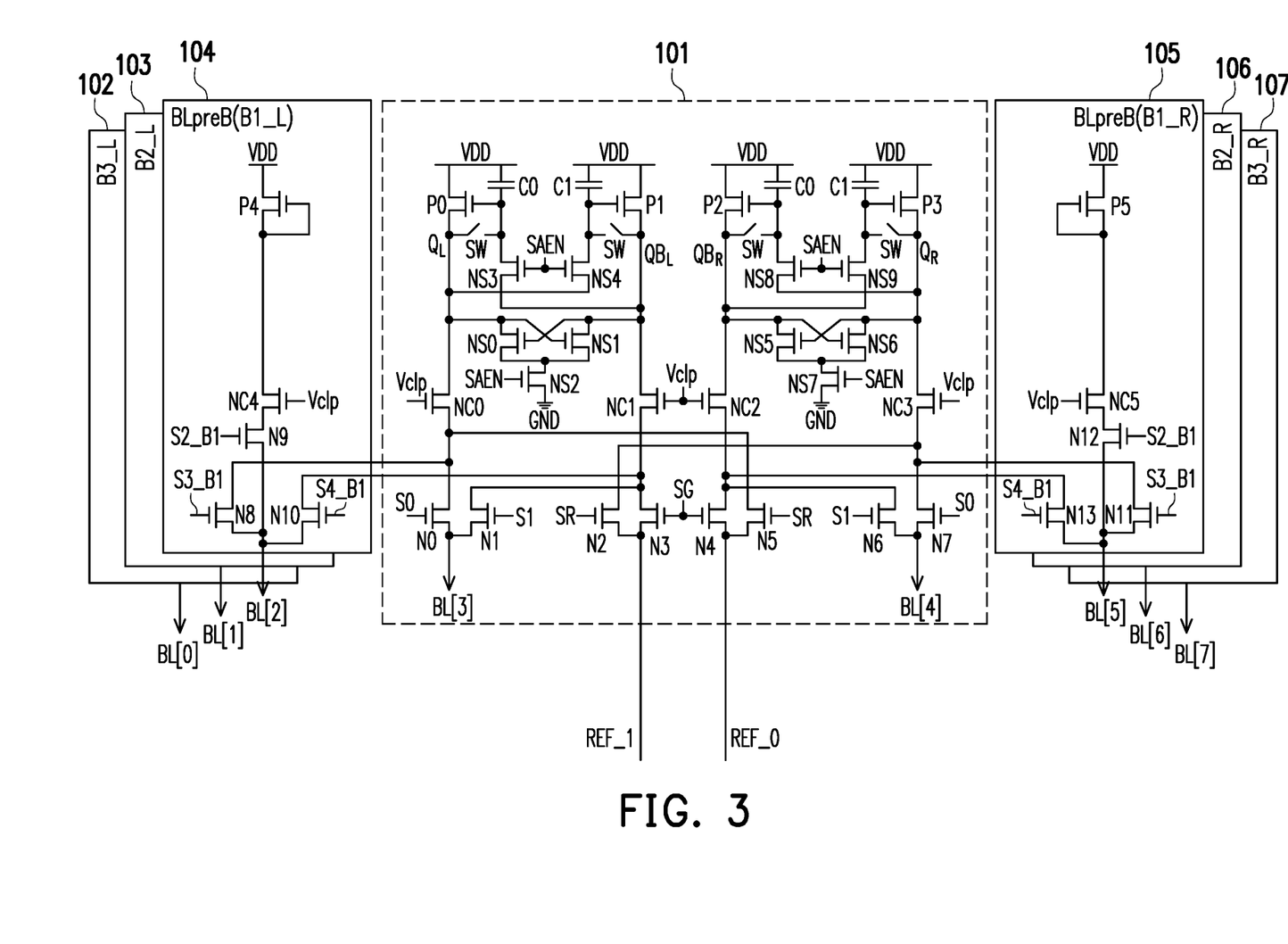
FIG. 3 is a schematic diagram of a sense amplifier circuit of a sense amplifier in accordance with some embodiments.

FIG. 3 illustrates is a schematic diagram of a sense amplifier circuit 141 in accordance with some embodiments. The sense amplifier circuit 141 could be any one of the sense amplifier circuits 141_0 through 141_m shown in FIG. 2. Referring to FIG. 2 and FIG. 3, the sense amplifier circuit 141 includes the core sense circuit 101 and the bit line pre-charge branch circuits 102 through 107, in which the core sense circuit 101 is coupled to the bit lines BL[3] and BL[4], and each of the bit line pre-charge branch circuits 102 through 107 is coupled to one of the bit lines BL[0] through BL[2] and BL[5] through BL[7]. The sense amplifier circuit 141 is configured to sense values from multiple bit lines to generate multi-bit data in one single memory access cycle.

In some embodiments, the sense amplifier circuit 141 refers to a multi-bit current sense amplifier circuit that is configured to sense currents flowing through the bit lines and to output a multi-bit data in one single memory access cycle (i.e., in one clock cycle).

In some embodiments, the core sense circuit 101 includes transistors P0 and P3, capacitors C0 and C3, a plurality of switches SW, latch transistors NS0, NS1, NS5 and NS6, latch transistors NS3, NS4, NS8 and NS9, clamping transistors NC0 through NC3, path switching transistors N1 through N9, and enable transistors NS2 and NS7. The transistors P0 and P3 are coupled to the bit lines BL[3] and BL[4], respectively; and the transistors P1 and P2 are coupled to the reference nodes REF_0 and REF_1, respectively. The capacitors C0 through C3 are coupled to the transistors P0 through P3, respectively; and each of the switches SW is coupled one of the capacitors C0 through C3 and one of the bit lines BL[3], BL[4] and reference nodes REF_0, REF_1. The latch transistor NS0 is cross-coupled to the latch transistor NS1; and the latch transistor NS5 is cross-coupled to the latch transistor NS6. In addition, the gate terminal of the latch transistor NS3 is electrically coupled to the gate terminal of the latch transistor NS4; the gate terminal of the latch transistor NS8 is electrically coupled to the gate terminal of the latch transistor NS9; and the gate terminals of the latch transistors NS3, NS4, NS8 and NS9 receive the enable signal SAEN. The latch transistors NS0, NS1, NS3 and NS4 are coupled to output nodes $Q_L$ and $QB_L$; and the latch transistor NS5, NS6, NS8 and NS9 are coupled to output nodes $Q_R$ and $QB_R$.

In the embodiments, the enable transistor NS2 is coupled between a reference node (i.e., GND) and a connection node between the latch transistors NS0 and NS1. The enable transistor NS7 is coupled between the reference node (i.e., GND) and a connection node between the latch transistors NS5 and NS6. The gate terminal of enable transistors NS2 and NS7 are also receive the enable signal SAEN. The clamping transistors NC0 through NC3 have the gate terminals receiving the clamp signals Vclp, and is switched on or off according to the clamp signals Vclp. The path switching transistors N0 through N7 are coupled between the bit lines BL[3], BL[4], reference nodes REF_0 and REF_1 and the internal nodes of the sense amplifier circuits 141. The switching transistors N0 through N7 are configured to form electrical path between the bit lines BL[3], BL[4], reference nodes REF_0 and REF_1 and the internal nodes according to signals S0 and S1.

In some embodiments, each of the bit line pre-charge branch circuits 102 through 107 includes a pre-charge transistor, a clamping transistor, and a plurality of path switching transistors. For example, the bit line pre-charge branch circuit 104 includes a includes a pre-charge transistor P4, a clamping transistor NC4, and a plurality of path switching transistors N8 through N10. The gate terminal of the clamping transistor NC4 receives the clamp signal Vclp; and the gate terminals of the path switching transistors N8 through N10 receives signals S2_B1, S3_B1 and S4_B1, respectively. In another example, the bit line pre-charge branch circuit 105 includes a includes a pre-charge transistor P5, a clamping transistor NC5, and a plurality of path switching transistors N11 through N13. The gate terminal of the clamping transistor NC5 receives the clamp signal Vclp; and the gate terminals of the path switching transistors N11 through N13 receives signals S2_B1, S3_B1 and S4_B1, respectively. The bit line pre-charge branch circuits 102, 103, 106 and 107 have the same structures as the bit line pre-charge branch circuits 104 and 105, thus the detailed description about the bit line pre-charge branch circuits 102, 103, 106 and 107 is omitted hereafter.

Figure 4:
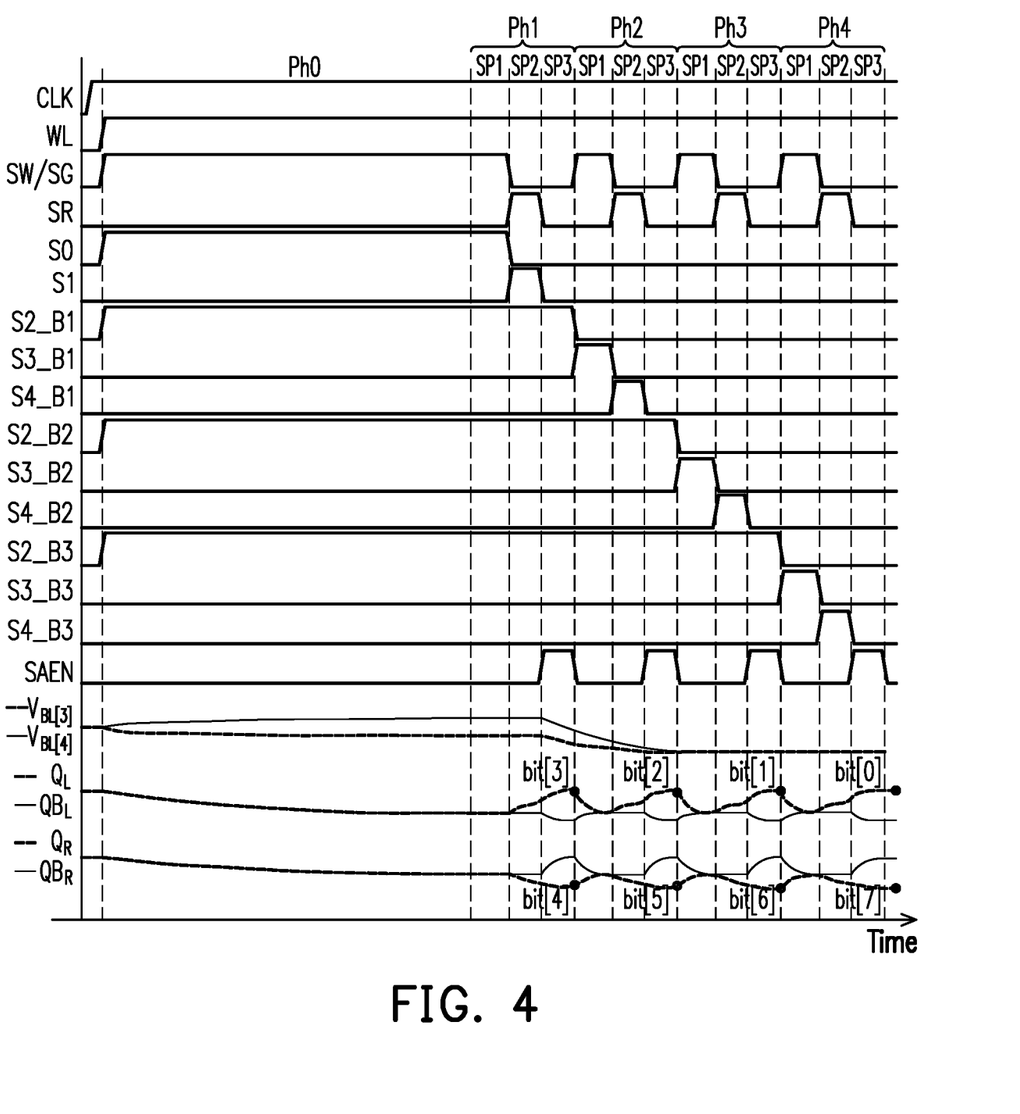
FIG. 4 is a waveform diagram of signals in a sense amplifier in accordance with some embodiments.

FIG. 4 illustrates a waveform diagram of a plurality of signals in the sense amplifier 140 in accordance with some embodiments. The signals illustrated in FIG. 4 includes a clock signal CLK, a word line signal WL that is applied to the word line of the memory cells in a memory operation, a switch signal SW/SG that is applied to the switches SW, signals SR, S0, S1 that are applied to the path switching transistors N0 through N7, signals S2_B1, S3_B1 and S4_B1 that are applied to transistors of bit line pre-charge branch circuit 104 and 105 (similarly, the signals S2_B2, S3_B2 and S4_B2, and signals S2_B3, S3_B3 and S4_B3 are applied to transistors of the bit line pre-charge branch circuit 102 to 103 and 106 to 107). FIG. 4 further illustrates the enable signal SAEN, and the signals from the bit lines BL[3], BL[4], and output signals at the output nodes $Q_L$, $WB_L$, $Q_R$, $QB_R$.

Referring to FIG. 2 through FIG. 4, the sense amplifier circuit 141 may perform a read operation by sensing a plurality of bit lines (i.e., bit lines BL[0] through BL[7]) to output multi-bit data (i.e., 8-bit data) in one clock cycle. The read operation may include a plurality of phases Ph0 through Ph4, in which the bit lines BL[0] through BL[7] are pre-charged in the pre-charge phase Ph0, the data from the bit lines BL[3] and BL[4] are sensed in the first sensing phase Ph1; the data from bit line BL[2] and BL[5] are sensed in the second sensing phase Ph2; the data from bit line BL[1] and BL[6] are sensed in the third sensing phase Ph3; and the data from bit line BL[0] and BL[7] are sensed in the fourth sensing phase Ph4.

In the pre-charge phase Ph0, the transistors P0 through P5 are switched on to pre-charge the bit lines BL[0] through BL[7] and the reference nodes REF_0 and REF_1 to the target voltage. The pre-charge phase Ph0 is shared for all subsequent sensing phases Ph1 through Ph4, thus the pre-charging operation is not re-performed after each of the sensing phases Ph1 through Ph4. In the first sensing phase Ph1, the data from the bit line BL[3] and BL[4] are sensed to output 2-bit data. The first sensing phase Ph1 includes three sub-phases SP1 through SP3, in which a current sampling operation is performed during the sub-phase SP1, a current subtracting operation is performed in the sub-phase SP2, and a latching operation is performed in the sub-phase SP3. During the sub-phase SP1, the transistors P0 through P3 and the switches SW are controlled to store the gate-source voltage of the transistors P0 through P3 to the capacitor C0 through C3, respectively. The gate-source voltage of the transistors P0 through P3 are stored for current sampling, so as to suppress the input offset for given currents flowing through the bit lines BL[3] and BL[4] and the reference nodes REF_0 and REF_1. During the sub-sensing phase SP2, the switches SW, the path switching transistors n0 through N7 are controlled to form a plurality of current subtracting paths. A first current subtracting path is formed by the transistor P0, the clamping transistor NC0, the path switching transistor N5 and the reference node REF_0. A second current subtracting path is formed by the transistor P1, the clamping transistor NC1, the path switching transistor N1 and the bit line BL[3]. A third current subtracting path is formed by the transistor P2, the clamping transistor NC2, the path switching transistor N6 and the bit line BL[4]. A fourth current subtracting path is formed by the transistor P3, the clamping transistor NC3, the path switching transistor N2 and the reference node REF_1. As the formation of the current subtracting paths, the voltages on the output nodes $Q_L$, $WB_L$, $Q_R$, $QB_R$ are swung as shown in FIG. 4.

During the sub-sensing phase SP3, the enable signal SAEN is asserted (i.e., logic state of the enable signal SAEN is "1"), the latching transistors NS3, NS4, NS8, NS9 are turned on to form two latches including a first latch formed by the transistors NS0, P0, NS1, P1 and a second latched formed by the transistors NS5, P2, NS6, P3. The two latches generate the two differential digital outputs ($Q_L/QB_L$ and $Q_R/QB_R$). At the end of the sub-phase SP3, the digital outputs bit[3] and bit[4] which are sensed from the bit lines BL[3] and BL[4] are outputted.

The sub-phases SP1 through SP3 in each of the sensing phases SP2 through SP4 may be deduced form the above description of the sensing phases SP1, thus the detailed description about the sensing of the bit[1] through bit[2] and bit[5] through bit[7] in the sensing phases Ph2 through SP4 is omitted hereafter. Once the sensing phases SP1 through SP4 are performed, the multi-bit data (i.e., bit [0] through bit[7]) is outputted by the sense amplifier circuit 141.

In each of the sensing phases Ph1 through Ph4, the enable signal SAEN is asserted (i.e., logic state of the enable signal SAEN is "1") to the sense amplifier circuit 141 during the sub-phase SP3 only. Referring to FIG. 2 and FIG. 4, the reference sharing circuit 142 is configured to switch off the switches SW1_0 through SW1_m and SW2_0 through SW2_m during the sub-phase SP3 in each of the sensing phases Ph1 through Ph4. The reference sharing circuit 142 is further configured to switch on the switches SW1_0 through SW1_m and SW2_0 through SW2_m during the sub-phases SP1 and SP2 in each of the sensing phases Ph1 through Ph4. In an embodiment, the reference sharing circuit 142 is further configured to switch off the switches SW1_0 through SW1_m and SW2_0 through SW2_m during the pre-charge phase Ph0. Since the switches SW1_0 through SW1_m and SW2_0 through SW2_m are switched off during the pre-charge phase Ph0 and during the period where the enable signal SAEN is asserted, the operations of the sense amplifier circuit 141 are performed normally. In addition, since the switches SW1_0 through SW1_m and SW2_0 through SW2_m are switched on during the period where the enable signal SAEN is not asserted to merge the reference nodes REF_0 of the sense amplifier circuits 141_0 through 141_m and to merge the reference nodes REF_1 of the sense amplifier circuits 141_0 through 141_m, the variability of the reference signals on the reference nodes REF_1 and the variability of the reference signals on the reference nodes REF_0 is reduced. Accordingly, the performance of the sense amplifier in the disclosure is improved.

Figure 5:
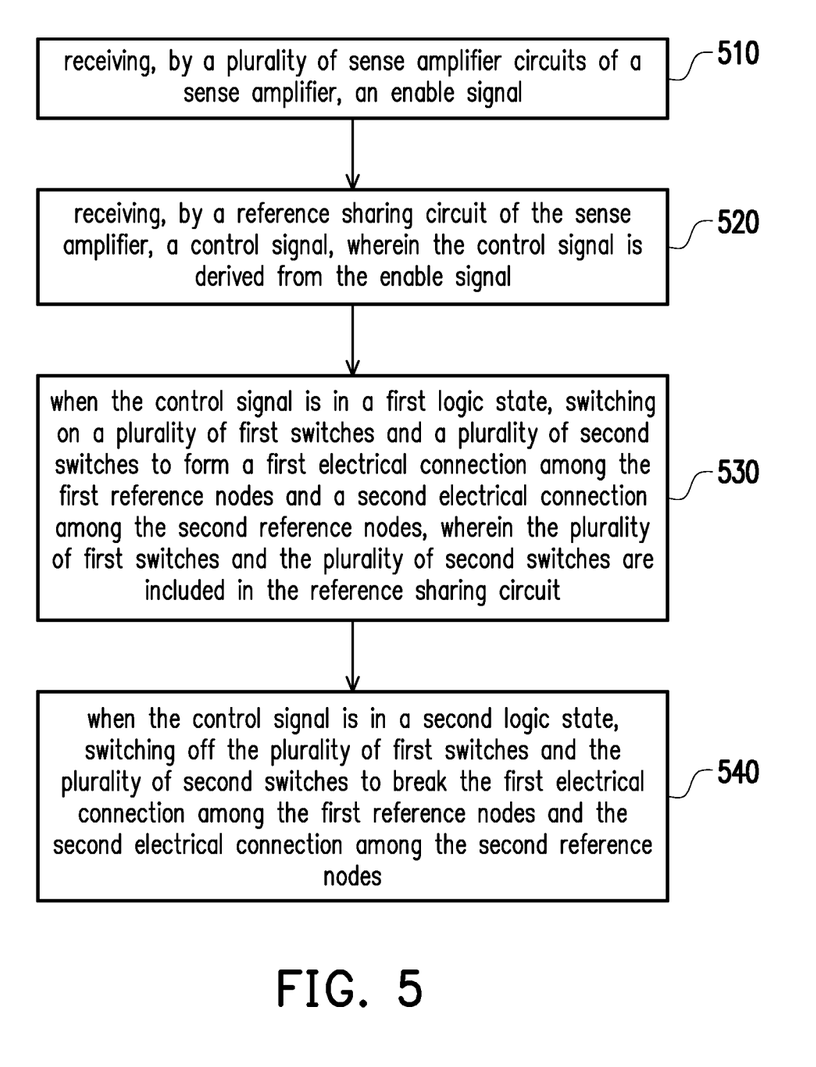
FIG. 5 is a flowchart diagram illustrating an operation method of a sense amplifier in accordance with some embodiments.

FIG. 5 illustrates a flowchart diagram of an operation method of a sense amplifier in accordance with some embodiments. In blocks 510 and 520, an enable signal is received by a plurality of sense amplifier circuits of a sense amplifier, and a control signal is received by the reference sharing circuit of the sense amplifier, wherein the control signal is derived from the enable signal. In block 530, when the control signal is in a first logic state, a plurality of first switches and a plurality of second switches are switched on to form a first electrical connection among the first reference nodes and a second electrical connection among the second reference nodes, wherein the plurality of first switches and the plurality of second switches are included in the reference sharing circuit. In block 540, when the control signal is in a second logic state, the plurality of first switches and the plurality of second switches are switched off to break the first electrical connection among the first reference nodes and the second electrical connection among the second reference nodes.

In some embodiments, a sense amplifier of a memory device includes a plurality of sense amplifier circuits and a reference sharing circuit. The plurality of sense amplifier circuits include first reference nodes and second reference nodes, and are configured to sense the plurality of bit lines according to an enable signal. The reference sharing circuit is coupled to the first reference nodes and the second reference nodes of the plurality of sense amplifier circuits. The reference sharing circuit includes a plurality of first switches and a plurality of second switches. The plurality of first switches are coupled to the first reference nodes of the plurality of sense amplifier circuits, and are configured to control a first electrical connection among the first reference nodes according to a control signal. The control signal is derived from the enable signal. The plurality of second switches are coupled to the second reference nodes of the plurality of sense amplifier circuits, and are configured to control a second electrical connection among the second reference nodes according to the control signal.

In some embodiments, a memory device includes a memory array and a sense amplifier. The memory array includes a plurality of memory cells. The sense amplifier of a memory device includes a plurality of sense amplifier circuits and a reference sharing circuit. The plurality of sense amplifier circuits include first reference nodes and second reference nodes, and is configured to sense the plurality of bit lines according to an enable signal. The reference sharing circuit is coupled to the first reference nodes and the second reference nodes of the plurality of sense amplifier circuits. The reference sharing circuit includes a plurality of first switches and a plurality of second switches. The plurality of first switches are coupled to the first reference nodes of the plurality of sense amplifier circuits, and are configured to control a first electrical connection among the first reference nodes according to a control signal. The control signal is derived from the enable signal. The plurality of second switches are coupled to the second reference nodes of the plurality of sense amplifier circuits, and are configured to control a second electrical connection among the second reference nodes according to the control signal.

In some embodiments, an operation method of a sense amplifier is introduced, where the sense amplifier includes a plurality of sense amplifier circuits and a reference sharing circuit, the reference sharing circuit is coupled to first reference nodes and second reference nodes of the plurality of sense amplifier circuits. The operation method includes steps of receiving, by the plurality of sense amplifier circuits of the sense amplifier, an enable signal; receiving, by the reference sharing circuit of the sense amplifier, a control signal, wherein the control signal is derived from the enable signal; when the control signal is in a first logic state, switching on a plurality of first switches and a plurality of second switches to form a first electrical connection among the first reference nodes and a second electrical connection among the second reference nodes, wherein the plurality of first switches and the plurality of second switches are included in the reference sharing circuit; and when the control signal is in a second logic state, switching off the plurality of first switches and the plurality of second switches to break the first electrical connection among the first reference nodes and the second electrical connection among the second reference nodes.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A sense amplifier of a memory device, comprising:
a plurality of sense amplifier circuits, including first reference nodes and second reference nodes, sensing the plurality of bit lines according to an enable signal; and
a reference sharing circuit, coupled to the first reference nodes and the second reference nodes of the plurality of sense amplifier circuits, wherein the reference sharing circuit comprises:
a plurality of first switches, coupled to the first reference nodes of the plurality of sense amplifier circuits, controlling a first electrical connection among the first reference nodes according to a control signal, wherein the control signal is derived from the enable signal; and
a plurality of second switches, coupled to the second reference nodes of the plurality of sense amplifier circuits, controlling a second electrical connection among the second reference nodes according to the control signal.

2. The sense amplifier of claim 1, wherein
when the control signal is in a first logic state, the plurality of first switches and the plurality of second switches are switched on to form the first electrical connection among first reference nodes and the second electrical connection among second reference nodes, and
when the control signal is in a second logic state, the plurality of first switches and the plurality of second switches are switched off to break the first electrical connection among first reference nodes and the second electrical connection among second reference nodes.

3. The sense amplifier of claim 2, wherein
the control signal is an inverted signal of the enable signal.

4. The sense amplifier of claim 3, wherein
the plurality of first switches and the plurality of second switches are transistors of a same semiconductor type.

5. The sense amplifier of claim 3, wherein
the plurality of bit lines include first bit lines and second bit lines, and
each of the plurality of sense amplifier circuits comprises:
a core sense circuit, coupled to the first bit lines, pre-charging the first bit lines to a target voltage in a pre-charge phase, sensing values from first bit lines in a first sensing phase, and sensing values from the second bit lines in a second sensing phase; and
a plurality of bit line pre-charge branch circuits, coupled to the second bit lines, pre-charging the second bit lines to the target voltage in the pre-charge phase, wherein the pre-charge phase is performed prior to the first sensing phase and the second sensing phase.

6. The sense amplifier of claim 5, wherein
the plurality of first switches and the plurality of second switches are switched off during the pre-charge phase.

7. The sense amplifier of claim 5, wherein
each of the first phase and the second phase includes a first sub-phase during which the enable signal is in the second logic state and a second sub-phase during which the enable signal is in the first logic state,
the plurality of first switches and the plurality of second switches of the reference sharing circuit are switched on during the first sub-phase, and
the plurality of first switches and the plurality of second switches of the reference sharing circuit are switched off during the second sub-phase.

8. The sense amplifier of claim 1, wherein
the first reference nodes supply first reference signals for sensing a first logic value from the plurality of bit lines, and
the second reference nodes supply second reference signals for sensing a second logic value from the plurality of bit lines.

9. A memory device, comprising:
a memory array, including a plurality of memory cells;
a sense amplifier, coupled to the memory array through a plurality of bit lines, sensing values stored in the plurality of memory cells through the plurality of bit lines, wherein the sense amplifier comprises:
a plurality of sense amplifier circuits, including first reference nodes and second reference nodes, sensing the plurality of bit lines according to an enable signal; and
a reference sharing circuit, coupled to the first reference nodes and the second reference nodes of the plurality of sense amplifier circuits, wherein the reference sharing circuit comprises:
a plurality of first switches, coupled to the first reference nodes of the plurality of sense amplifier circuits, controlling a first electrical connection among the first reference nodes according to a control signal, wherein the control signal is derived from the enable signal; and
a plurality of second switches, coupled to the second reference nodes of the plurality of sense amplifier circuits, controlling a second electrical connection among the second reference nodes according to the control signal.

10. The memory device of claim 9, wherein
when the control signal is in a first logic state, the plurality of first switches and the plurality of second switches are switched on to form the first electrical connection among first reference nodes and the second electrical connection among second reference nodes, and
when the control signal is in a second logic state, the plurality of first switches and the plurality of second switches are switched off to break the first electrical connection among first reference nodes and the second electrical connection among second reference nodes.

11. The memory device of claim 10, wherein
the control signal is an inverted signal of the enable signal.

12. The memory device of claim 11, wherein
the plurality of bit lines include first bit lines and second bit lines, and
each of the plurality of sense amplifier circuits comprises:
a core sense circuit, coupled to the first bit lines, pre-charging the first bit lines to a target voltage in a pre-charge phase, sensing values from first bit lines in a first sensing phase, and sensing values from the second bit lines in a second sensing phase; and
a plurality of bit line pre-charge branch circuits, coupled to the second bit lines, pre-charging the second bit lines to the target voltage in the pre-charge phase, wherein the pre-charge phase is performed prior to the first sensing phase and the second sensing phase.

13. The memory device of claim 12, wherein
the plurality of first switches and the plurality of second switches are switched off during the pre-charge phase.

14. The memory device of claim 12, wherein
each of the first phase and the second phase includes a first sub-phase during which the enable signal is in the second logic state and a second sub-phase during which the enable signal is in the first logic state,
the plurality of first switches and the plurality of second switches of the reference sharing circuit are switched on during the first sub-phase, and
the plurality of first switches and the plurality of second switches of the reference sharing circuit are switched off during the second sub-phase.

15. The sense amplifier of claim 9, wherein
the first reference nodes supply first reference signals for sensing a first logic value from the plurality of bit lines, and
the second reference nodes supply second reference signals for sensing a second logic value from the plurality of bit lines.

16. An operation method of a sense amplifier including a plurality of sense amplifier circuits and a reference sharing circuit, the reference sharing circuit is coupled to first reference nodes and second reference nodes of the plurality of sense amplifier circuits, the operation method comprising:
receiving, by the plurality of sense amplifier circuits of the sense amplifier, an enable signal;
receiving, by the reference sharing circuit of the sense amplifier, a control signal, wherein the control signal is derived from the enable signal;
when the control signal is in a first logic state, switching on a plurality of first switches and a plurality of second switches to form a first electrical connection among the first reference nodes and a second electrical connection among the second reference nodes, wherein the plurality of first switches and the plurality of second switches are included in the reference sharing circuit; and
when the control signal is in a second logic state, switching off the plurality of first switches and the plurality of second switches to break the first electrical connection among the first reference nodes and the second electrical connection among the second reference nodes.

17. The operation method of claim 16, wherein the plurality of bit lines include first bit lines and second bit lines, and the method further comprising:
pre-charging, by a core sense circuit of each of the plurality of sense amplifier circuits, the first bit lines to a target voltage in a pre-charge phase;
pre-charging, by a plurality of bit line pre-charge branch circuits of each of the plurality of sense amplifier circuits, the second bit lines to the target voltage in the pre-charge phase;
sensing values from first bit lines in a first sensing phase, and
sensing values from the second bit lines in a second sensing phase,
wherein the pre-charge phase is performed prior to the first sensing phase and the second sensing phase.

18. The operation method of claim 17, wherein
the control signal is an inverted signal of the enable signal.

19. The operation method of claim 17, wherein
the plurality of first switches and the plurality of second switches of the reference sharing circuit are switched off during the pre-charge phase.

20. The operation method of claim 17, wherein
each of the first phase and the second phase includes a first sub-phase during which the enable signal is in the second logic state and a second sub-phase during which the enable signal is in the first logic state,
the plurality of first switches and the plurality of second switches of the reference sharing circuit are switched on during the first sub-phase, and
the plurality of first switches and the plurality of second switches of the reference sharing circuit are switched off during the second sub-phase.

* * * * *